United States Patent [19]

Lannutti et al.

[11] Patent Number: 5,282,943
[45] Date of Patent: Feb. 1, 1994

[54] METHOD OF BONDING A TITANIUM CONTAINING SPUTTER TARGET TO A BACKING PLATE AND BONDED TARGET/BACKING PLATE ASSEMBLIES PRODUCED THEREBY

[75] Inventors: Susan M. Lannutti; Charles E. Wickersham, Jr., both of Columbus, Ohio

[73] Assignee: Tosoh SMD, Inc., Grove City, Ohio

[21] Appl. No.: 896,170

[22] Filed: Jun. 10, 1992

[51] Int. Cl.⁵ .............................................. C23C 14/34
[52] U.S. Cl. ........................ 204/192.12; 204/298.12; 228/208
[58] Field of Search .............. 204/192.12, 192/15, 204/298.12, 298.09; 228/208, 209, 263.21

[56] References Cited

U.S. PATENT DOCUMENTS

| | | | |
|---|---|---|---|
| 4,290,876 | 9/1981 | Nishiyama et al. | 204/298 |
| 4,341,816 | 7/1982 | Lauterbach et al. | 427/34 |
| 4,352,450 | 10/1982 | Edgington | 228/208 X |
| 4,430,190 | 2/1984 | Eilers et al. | 204/298 |
| 4,448,652 | 5/1984 | Pachonik | 204/298 |
| 4,544,091 | 10/1985 | Hidler et al. | 228/124 |
| 4,567,110 | 1/1986 | Jarvinen | 228/208 X |
| 4,569,745 | 2/1986 | Nagashima | 204/298 |
| 4,714,587 | 12/1987 | Eylon et al. | 419/29 |
| 4,747,927 | 5/1988 | Rille et al. | 204/298 |
| 5,009,765 | 4/1991 | Qamar et al. | 204/298 |

FOREIGN PATENT DOCUMENTS 188680 11/1982 Japan.
708387 1/1983 Japan.

OTHER PUBLICATIONS

"Magnetron Sputtered Titanium-Tungsten Films," Michael Hill, Solid State Technology, Jan. 1980, pp. 53-59.

Primary Examiner—Nam Nguyen
Attorney, Agent, or Firm—Biebel & French

[57] ABSTRACT

Methods of bonding a titanium containing sputter target member to a heat conductive backing member, such as a copper backing plate, and bonded target/backing plate assemblies are disclosed. Due to the poor wettability of titanium based materials, a uniform, thin film of aluminum is coated thereover and acts as an anchor layer for application of tin and/or indium based solder layers thereover to securely solder bond the target and backing plate. The aluminum coating is sputter coated onto the target. Then, the coated target is heated in an oxygen containing atmosphere. The thus treated titanium target is then ready for conventional solder joining to a copper backing plate or the like by use of tin, lead, and/or indium based solder metals.

8 Claims, 1 Drawing Sheet

METHOD OF BONDING A TITANIUM CONTAINING SPUTTER TARGET TO A BACKING PLATE AND BONDED TARGET/BACKING PLATE ASSEMBLIES PRODUCED THEREBY

FIELD OF THE INVENTION

The present invention pertains to methods for solder bonding a titanium or titanium alloy sputter target to a heat conductive backing plate member and to the target/backing plate assemblies which are fixedly secured to each other by such methods.

BACKGROUND OF THE INVENTION

Cathodic sputtering is widely used for the deposition of thin layers of material onto desired substrates. Basically, this process requires gas ion bombardment of a target having a face formed of a material that is to be deposited as a thin film or layer on a substrate. Ion bombardment of the target not only causes atoms or molecules of the target material to be sputtered, but imparts considerable thermal energy to the target. This heat is dissipated by use of a cooling fluid typically circulated beneath or around a heat conducting backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In addition to the use o an electrical field, increasing sputtering rates have been achieved by the concurrent use of an arch-shaped magnetic field that is superimposed over the electrical field and formed in a closed loop configuration over the surface of the target. These methods are known as magnetron sputtering methods. The arch-shaped magnetic field traps electrons in an annular region adjacent the target surface thereby increasing the number of electron-gas atom collisions in the area to produce an increase in the number of positively charged gas ions in the region that strike the target to dislodge the target material. Accordingly, the target material becomes eroded (i.e., consumed for subsequent deposition on the substrate) in a generally annular section of the target face, known as the target raceway.

In conventional target cathode assemblies, the target is attached to a nonmagnetic backing plate. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

Titanium targets and alloys containing Ti, such as Ti-W alloys are used as cathodic sputter targets to coat a plurality of substrates. Commonly, elemental Ti targets are used to provide contact metals in semiconductors with Ti-W alloys finding wide use as diffusion barriers between platinum silicide contacts and other interconnect metallizations.

Solder attachment of such titanium containing targets to heat conductive backing plate members, such as copper or aluminum backing plates, has proven troublesome due to the poor wettability between the target and tin, indium, and/or lead-based solders.

One approach to the problem has been to apply an anchor or adhesive layer of nickel or nickel aloy on the titanium via plasma spraying processes to provide a wettable surface for the solders. Unfortunately, plasma spraying processes induce a large amount of stress into the titanium, leading to warpage problems. Additionally, the nickel coating readily oxidizes during the heating of the titanium prior to soldering. This resulting oxide is not easily wetted by the solder. Another problem inherent in plasma coatings is unevenness of application, leading to the requirement that the anchor or adhesive layer must be sanded prior to soldering.

PRIOR ART

U.S. Pat. No. 4,341,816 (Lauterbach et al) discloses plasma spray application of an adhesive layer composed of Ni, Ni/Cr; 80/20 Ni/Al; Ni/Al/Mo; Al/bronze; Mo; W; Al; Al/Si; Zn, Cu; and Cu/glass mixtures onto the target. A solderable cover layer of from 30–100 um consisting of a material selected from Cu; Cu/glass; or Ag is plasma spray coated over the adhesive layer. The target body and the cooling plate can be pre-soldered with the use of suitable soft solder fluxing agents. Thereafter, the target body is soldered onto the cooling plate by means of reflow soldering without employment of a fluxing agent.

Somewhat similar in import is Japanese Patent 57-188680 (Fujio Ishikawa et al.). Here, an intermediate layer and then a solderable layer composed of Cu, Ni, Sn, or their alloys are plasma spray coated onto the target.

U.S. Pat. No. 4,544,091 (Hidler et al.) discloses the use of a substantially oxide-free noble metal, such as platinum, that is painted onto a target to serve as an intermediate layer over which a solder layer is applied to bond the target and the backing plate member.

Other patents which may be of interest to the invention include U.S. Pat. No. 4,747,927 (Rille et al.); 4,290,876 (Nishiyama et al.); 5,009,765 (Qamar et al.); 4,714,587 (Eylon et al.); 4,448,652 (Pachonik); Japanese Patent 83-708387/28; 4,430,190 (Eilers et al.); and 4,569,745 (Nagashima).

SUMMARY OF THE INVENTION

In accordance with the invention, a thin coating of aluminum is applied to a titanium or titanium alloy sputter target surface by a cathodic sputter coating process. The aluminum coated titanium target is then heat treated to strip away titanium oxides from the target. A solderable metal layer, such as a Sn, Pb and/or In solder layer is then applied to the heat treated aluminum surface of the target with a heat conductive backing plate member solder bonded to the solder layer to fixedly secure the target and backing plate.

The invention will be further described in the following detailed description of the preferred embodiments read in conjunction with the appended drawings.

DETAILED DESCRIPTION OF THE PREFERRED EMBODIMENT

Figure 1:
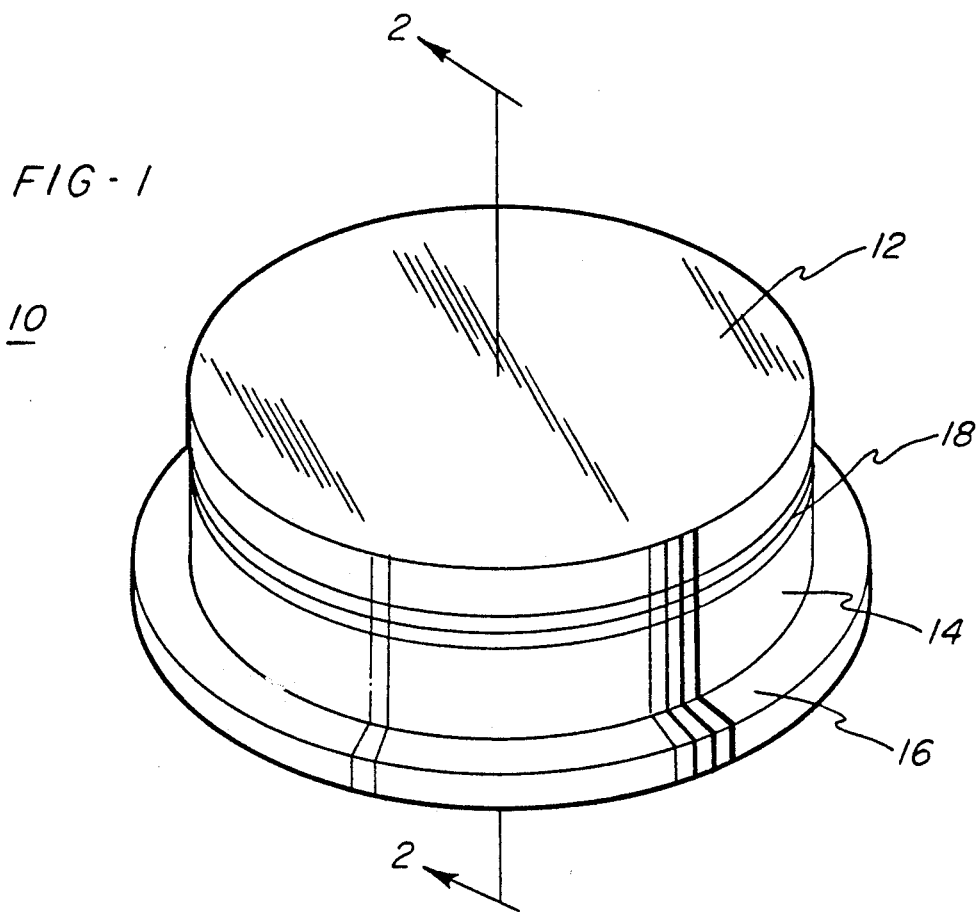
FIG. 1 is an elevational view of a disc-shaped titanium target solder bonded to a backing plate in accordance with the invention.

Turning first to FIG. 1, there is shown a solder bonded target/backing plate assembly in accordance with the invention. Target 12 is composed of elemental titanium or titanium alloy, such as a Ti-W alloy. Target 12 is superposed atop heat conductive backing plate 14 along joint 18. A peripheral flange 16, integral with backing plate 14, serves to mount the assembly as a cathode in an evacuated sputter coating housing in accordance with well known techniques.

Figure 2:
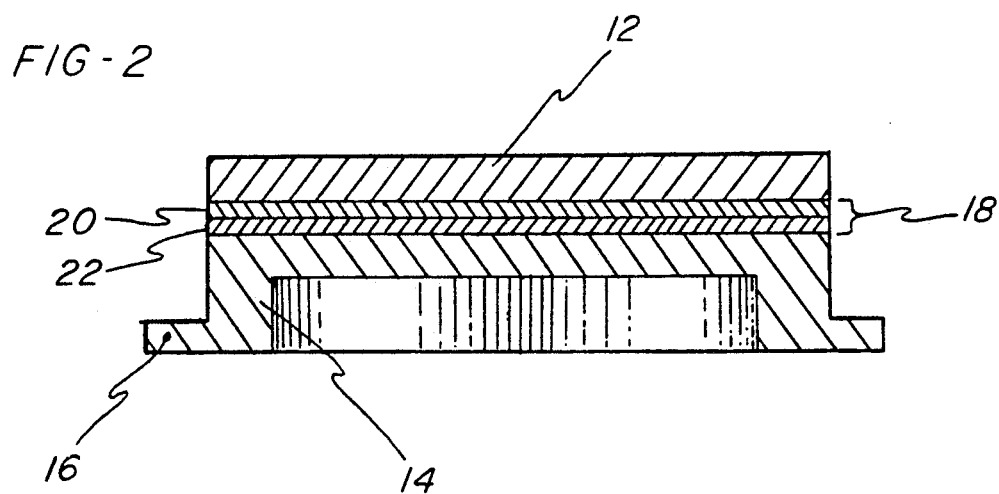
FIG. 2 is a sectional view of the target and backing plate shown in FIG. 1, taken along the lines and arrows 2—2 of FIG. 1.

As shown in FIG. 2, a thin coating 20 of aluminum is applied to the underside of target 12 to serve as an adhesive or anchor layer for application of a solderable metal layer 22 thereover. The coating 20 is applied to the target by cathodic sputter deposition methods which insure that a uniform, thin coating of aluminum is provided. This coating can be on the order of from about 0.5-5 microns in thickness, with a preferred thickness being on the order of 1-3 um.

In most cases, prior to the application of the aluminum coating 20 over a portion of the target 12, the target is pre-cleaned so as to be free of grease, solvents or other contaminants that would adversely affect the integrity of the sputtered aluminum coating. In this regard, exemplary cleaning techniques include degreasing, acid cleaning, mechanical cleaning with abrasives and chemical etching.

Sputter coating of the thin layer 20 provides significant improvement over prior art processes in which the adhesive or anchor layer is applied via plasma spray methods. For example, plasma spraying induces a large amount of stress into the Ti containing target 12 leading to target warpage. Further, plasma spray coating is not uniform, resulting in uneven spots over the treated surface. This necessitates a sanding step prior to application of the solderable metal layer 22 over the adhesive or anchor layer 20.

In the presently preferred embodiment, Al is sputter coated over a Ti target surface by the use of a Tosoh ICS-50 cathodic sputtering machine with the following parameters:

1-3 um thick Al coating
no substrate bias
sputtering power 3 KW
6 um Argon as the inert gas After cathodic sputter coating application of coating 20 to the Ti containing target 12, the so-treated target is heat treated in an oxygen containing atmosphere at temperatures of from 300-500° C. for a period of from 5-22 hours. Preferably, the aluminum coated target is treated at about 400° C. for 16 hours in air.

Heat treatment is critical to provide adequate adherence of the Al coating to the required surface of the Ti containing target. Although applicants are not to be bound to any particular theory of operation of their invention, it is thought that heat treatment of the aluminum coating strips away titanium oxides that have formed leaving free titanium for bonding to the solder metal layer 22.

After the heat treatment step, the surfaces of the target and associated backing plate are wetted with a conventional tin, lead, or indium based solder. Soldering is preferably conducted without flux when the sputter target 12 is to be used for semi-conductor applications. To this end, a protective atmosphere may be used to protect against oxide formation on the surfaces to be joined. Conventional heating methods including induction soldering, resistance soldering, furnace soldering, infrared soldering, and ultrasonic soldering may be used.

Preferably, an elemental, high purity titanium target is solder bonded in accordance with the invention to a copper backing plate. In lieu of a copper backing plate, an aluminum or stainless steel backing plate can be used.

Upon completion of the process, a solder bonded target 12 is fixedly secured to the underlying backing pate member 14 with the provision of a thin aluminum coating 20 and solderable metal layer 22 intermediate the target and backing plate with the aluminum coating layer 20 serving to provide a readily wettable surface for the solderable metal layer.

The preceding description and accompanying drawings are intended to be illustrative of the invention and should not be construed as limitations thereon. Various other modifications and applications will be apparent to those skilled in the art without departing from the true spirit and scope of the invention as defined by the following claims.

We claim:

1. Method of bonding a titanium containing sputtering target to a heat conductive backing plate comprising the steps of
sputtering a thin coating of aluminum on a portion of said target to form a coated target, heating said coated target at a temperature of from about 300-500° C. in an oxygen-containing atmosphere, and then soldering said target to said backing plate along said thin coating of aluminum.

2. Method as recited in claim 1 wherein said backing plate comprises copper.

3. Method as recited in claim 1 wherein said step of sputtering comprises sputter coating from about 0.5-5 um of said aluminum onto said titanium containing target.

4. Method as recited in claim 3 wherein said step of sputtering comprises sputter coating from about 1-3 um of said aluminum onto said titanium containing target.

5. Method as recited in claim 1 wherein said heating comprises heat treating said coated target for about 5-22 hours.

6. Method as recited in claim 5 comprising heating said coated target at a temperature of about 400° C. for a period of about 16 hours.

7. Assembly comprising a titanium containing sputtering target and a heat conductive backing plate member, said assembly being produced by the method of claim 5.

8. Assembly comprising a titanium containing sputtering target and a heat conductive backing plate member, said assembly being produced by the method of claim 1.

* * * * *